(12) United States Patent
Mou et al.

(10) Patent No.: US 12,224,279 B2
(45) Date of Patent: Feb. 11, 2025

(54) INTEGRATED MULT-DEVICE CHIP AND PACKAGE

(71) Applicant: Littelfuse Semiconductor (Wuxi) Co., Ltd., Wuxi (CN)

(72) Inventors: Tsung-Wen Mou, Wuxi (CN); Lei Shi, Wuxi (CN); Jifeng Zhou, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 673 days.

(21) Appl. No.: 17/615,927

(22) PCT Filed: Jun. 3, 2019

(86) PCT No.: PCT/CN2019/089797
§ 371 (c)(1),
(2) Date: Dec. 2, 2021

(87) PCT Pub. No.: WO2020/243875
PCT Pub. Date: Dec. 10, 2020

(65) Prior Publication Data
US 2022/0320072 A1 Oct. 6, 2022

(51) Int. Cl.
*H01L 27/02* (2006.01)
*H01L 23/495* (2006.01)
*H01L 23/31* (2006.01)

(52) U.S. Cl.
CPC .... *H01L 27/0259* (2013.01); *H01L 23/49541* (2013.01); *H01L 27/0255* (2013.01); *H01L 23/3121* (2013.01); *H01L 27/0292* (2013.01)

(58) Field of Classification Search
CPC ............ H01L 23/495; H01L 23/49537; H01L 23/49541; H01L 23/49524; H01L 27/0248;
(Continued)

(56) References Cited

U.S. PATENT DOCUMENTS

| 5,365,086 A | 11/1994 | Pezzani |
| 6,559,515 B1 | 5/2003 | Duclos |

(Continued)

FOREIGN PATENT DOCUMENTS

| CN | 105826366 | 12/1899 |
| CN | 1131823 A | 9/1996 |

(Continued)

OTHER PUBLICATIONS

European Search Report and Written Opinion for the Application No. EP19931615, mailed Dec. 13, 2022, 7 pages.
(Continued)

*Primary Examiner* — Wasiul Haider
(74) *Attorney, Agent, or Firm* — KDW Firm PLLC

(57) ABSTRACT

A protection device may include a semiconductor substrate and a thyristor-type device, formed within the semiconductor substrate, where the thyristor device extends from a first main surface of the semiconductor substrate to a second main surface of the semiconductor substrate. The protection device may include a first PN diode, formed within the semiconductor substrate; and a second PN diode, formed within the semiconductor substrate, wherein the thyristor-type device is arranged in electrical series between the first PN diode and the second PN diode.

17 Claims, 5 Drawing Sheets

(58) Field of Classification Search
CPC .............. H01L 27/0255; H01L 29/861; H01L 27/0259; H01L 27/0292; H01L 27/0262; H01L 29/74
See application file for complete search history.

(56) References Cited

U.S. PATENT DOCUMENTS

| | | |
|---|---|---|
| 6,870,202 B2 | 3/2005 | Oka |
| 2002/0020880 A1 | 2/2002 | Yu |
| 2004/0021148 A1 | 2/2004 | Simonnet |
| 2016/0336744 A1 | 11/2016 | Parthasarathy |
| 2017/0019526 A1* | 1/2017 | Simonnet .............. H04M 19/08 |
| 2018/0211904 A1* | 7/2018 | Cho .................. H01L 23/49562 |

FOREIGN PATENT DOCUMENTS

| | | |
|---|---|---|
| CN | 103872046 A | 6/2014 |
| CN | 105826366 A | 8/2016 |
| CN | 106356827 A | 1/2017 |
| CN | 108550573 A | 9/2018 |
| JP | H1098202 A | 4/1998 |

OTHER PUBLICATIONS

International Search Report and Written Opinion for the International Application No. PCT/CN2019/089797, mailed Mar. 13, 2020, 6 pages.
International Search Report and Written Opinion mailed Mar. 13, 2020 for PCT/CN2019/089797.

\* cited by examiner ously to indicate where an element, such as a layer, region, or substrate is referred to as being on, overlying, disposed on, or over another element. The terms are not intended to imply that such elements are directly on, overlying, disposed on, or over one another. Rather, embodiments may include additional elements between the elements so referred to.

INTEGRATED MULT-DEVICE CHIP AND PACKAGE

BACKGROUND

Field

Embodiments relate to the field of surge protection devices, and more particularly to overvoltage protection devices and resettable fuses.

Discussion of Related Art

Surge protection devices include over-voltage protection devices used to protect components, apparatus, or systems from damage due to over-voltage fault conditions, as well as fuses used to protect components, apparatus or systems from excessive current flow. In the field of overvoltage protection devices, diodes such as Zener diodes, thyristors, and SIDACtors® are known (® SIDACtor is a trademark of Littelfuse, Inc.).

In some commercial implementations, a thyristor-type device, such as a SIDACTor, may be placed in electrical series with a first diode and a second diode, providing protection for transmission lines, including telecommunications lines. As an example, the thyristor device may be formed in a first semiconductor chip, while the first diode and the second diode are formed in a second semiconductor chip and third semiconductor chip, respectively. The different chips may be coupled together within a single package to provide a protection device that may be placed at a desired location within a line to be protected. One issue with such a package is the complexity required for the structure of a lead frame to electrically couple the different semiconductor chips to one another and to outside electrical lines, to dissipate heat, as well as to hold the semiconductor chips within a compact package.

With respect to these and other considerations the present disclosure is provided.

SUMMARY

Exemplary embodiments are directed to improved protection devices. In one embodiment a protection device may include a semiconductor substrate and a thyristor-type device, formed within the semiconductor substrate, where the thyristor device extends from a first main surface of the semiconductor substrate to a second main surface of the semiconductor substrate. The protection device may include a first PN diode, formed within the semiconductor substrate; and a second PN diode, formed within the semiconductor substrate, wherein the thyristor-type device is arranged in electrical series between the first PN diode and the second PN diode.

In another embodiment a protection device assembly may include a semiconductor substrate having a first main surface and a second main surface. The semiconductor substrate may include a thyristor-type device, extending from a first main surface to the second main surface, a first PN diode, extending from the second main surface; and a second PN diode, wherein the thyristor-type device is arranged in electrical series between the first PN diode and the second N diode. The protection device assembly may also include a front surface metal layer, disposed on the first main surface, and a leadframe, disposed in contact with the second main surface.

In a further embodiment, a line protection device may include a semiconductor substrate having a first main surface and a second main surface. The semiconductor substrate may include a thyristor-type device, extending from a first main surface to the second main surface, a first PN diode, extending from the second main surface, a second PN diode, wherein the thyristor-type device is arranged in electrical series between the first PN diode and the second N diode. The semiconductor substrate may further include an electrical isolation barrier, extending from the first main surface to the second main surface, and disposed between the second PN diode and the thyristor-type device. The line protection device may include a front surface metal layer, disposed on the first main surface, and a leadframe, disposed in contact with the second main surface, the leadframe comprising a plurality of leads, arranged electrically in parallel to one another.

DESCRIPTION OF EMBODIMENTS

Figure 1A:
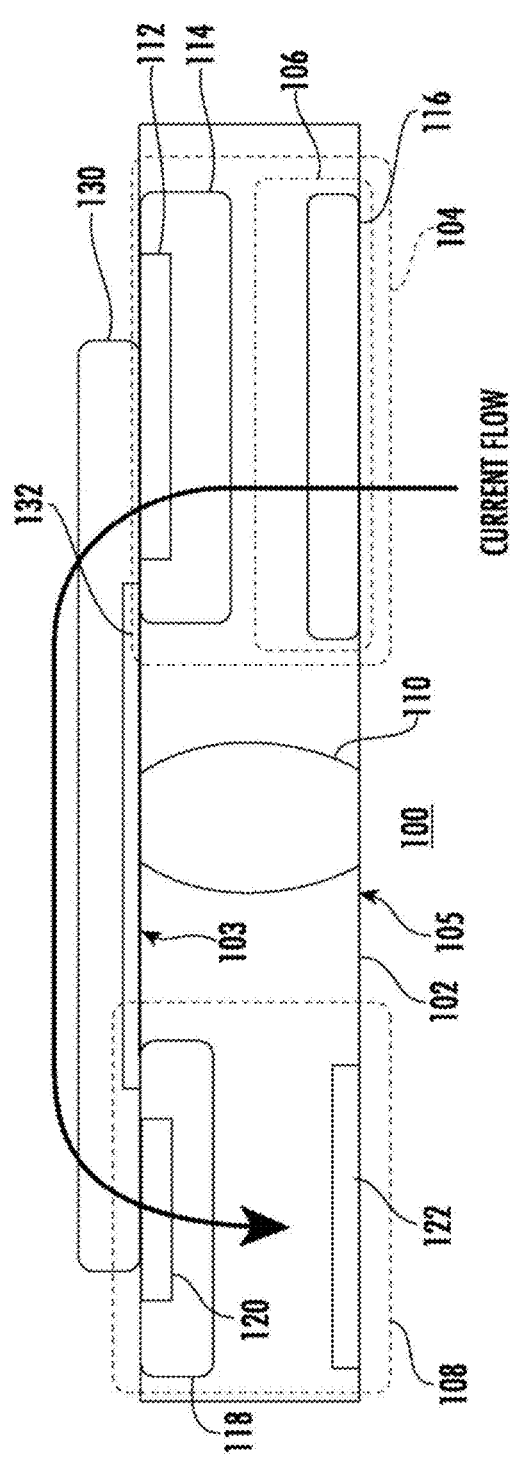
FIG. 1A presents a side cross-sectional view of a protection device 100, according to various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "either", and/or it may mean "both", although the scope of claimed subject matter is not limited in this respect.

In various embodiments a protection device and assembly are presented for protecting electrical components, systems, or electrical lines, such as communications lines. Various embodiments may include a protection device including a SIDACtor. As is known, a SIDACTor is related to a silicon controlled rectifier (SCR) or thyristor-type device, where an SCR is composed of a layered structure having an arrangement of N-type semiconductor regions or layers as well as P-type semiconductor layers or regions, in a four layer sequence of P-N-P-N, for example. In an SCR a gate is connected to an inner layer of the four layer device, while a SIDACtor lacks such a gate. In various embodiments a SIDACTor is provided in electrical series with a pair of PN diodes within a single semiconductor die ("semiconductor chip"). The integration of a SIDACTor and pair of diodes within a single semiconductor chip facilitates novel and lower cost packaging assemblies to house the semiconductor chip.

FIG. 1A presents a side cross-sectional view of a protection device 100, according to various embodiments of the disclosure. The protection device 100 may be formed within a semiconductor substrate 102, such as monocrystalline silicon, or similar suitable semiconductor material. The protection device 100 may include a thyristor-type device 104. The thyristor-type device 104 may be formed as a four-layer device, generally as known in the art. As shown in FIG. 1A, the thyristor-type device 104 may extend from a first main surface 103 to a second main surface 105, opposite the first main surface 103. In addition to the thyristor-type device 104, the protection device 100 may include a first PN diode 106, formed within the semiconductor substrate 102, and a second PN diode 108, formed within the semiconductor substrate 102. The arrangement of protection device 100 may place the thyristor-type device 104 in electrical series between the first PN diode 106 and the second PN diode 108.

As shown in FIG. 1A, the protection device 100 may include an electrical isolation barrier 110, extending from the first main surface 103 to the second main surface 105, and disposed between the second PN diode 108 and the thyristor-type device 104. In various embodiments, the electrical isolation barrier 110 may be an electrical insulator, formed according to known techniques. As shown in FIG. 1A, the first PN diode 106 may extend from the second main surface 105 and may form a part of the thyristor-type device 104. As such the thyristor-type device 104 may be arranged in electrical series between the first PN diode 106 and the second PN diode 108, where the direction of current flow under normal operation is shown by the curved arrow. As shown in FIG. 1A, the protection device 100 may also include a front surface metal layer 130, electrically connecting and in contact with the thyristor-type device 104 and the second PN diode 108, and a front surface oxide layer 132, disposed over the region between the thyristor-type device 104 and the second PN diode 108.

Figure 1B:
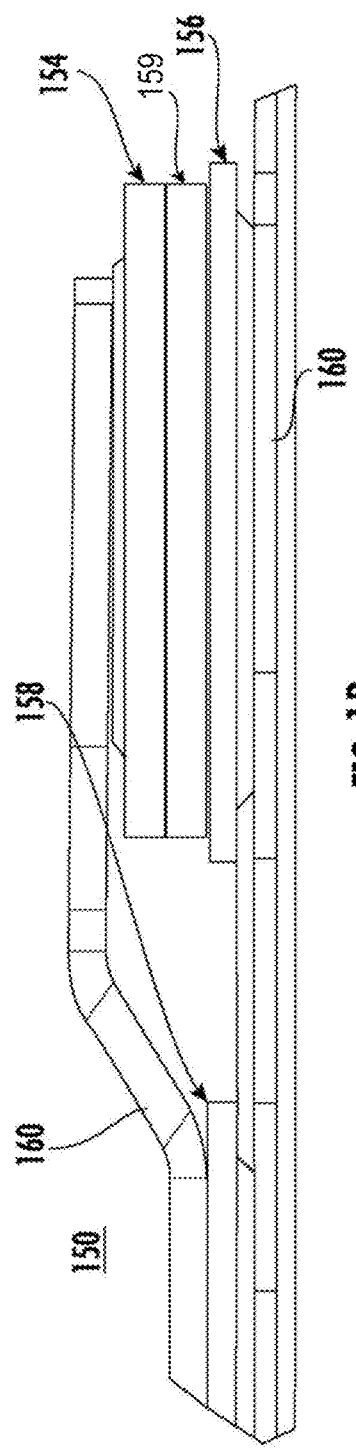
FIG. 1B depicts a reference device assembly.

To highlight the function of the protection device 100 a reference assembly 150 is shown in FIG. 1B in a side view. In this arrangement, a series of three known semiconductor chips are assembled in a package including a three-dimensional lead frame 160. The reference assembly 150 includes a semiconductor device 154, which device may be a thyristor-type device, a first PN diode 156, and a second PN diode 158, each embodied in a separate semiconductor chip. This arrangement provides semiconductor chips having relatively simpler structure to form the respective devices, as known in the art. The arrangement of the three semiconductor chips in FIG. 1B may provide the same of similar functionality to the protection device 100. Notably, the reference assembly 150 requires a relatively complex lead frame in order to house and couple the different semiconductor chips.

In some embodiments, the thyristor-type device 104 may include a layer 112, extending from the first main surface and disposed within a layer 114. The layer 112 may be an N+ layer in some embodiments, while the layer 114 is a P-type layer. The semiconductor substrate 102 may constitute an N− layer, while a layer 116 extends from the second main surface and is also a P-type layer In some embodiments, the second PN diode 108 includes a layer 118, which layer may be a P− layer, as well as a layer 120, embedded in the layer 118, such as a P+ layer. The second PN diode may additionally include a layer 122, such as a N+ layer.

Figure 2A:
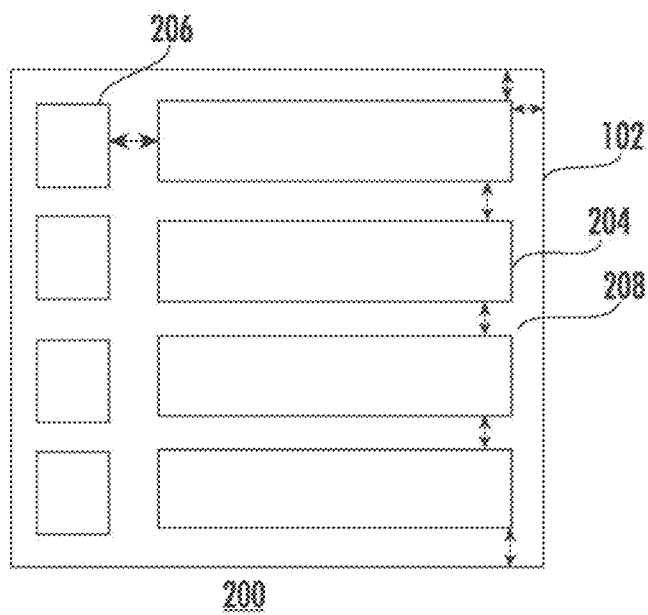
FIG. 2A shows a plan view of a second main surface of a protection device, according to embodiments of the disclosure.
Figure 2B:
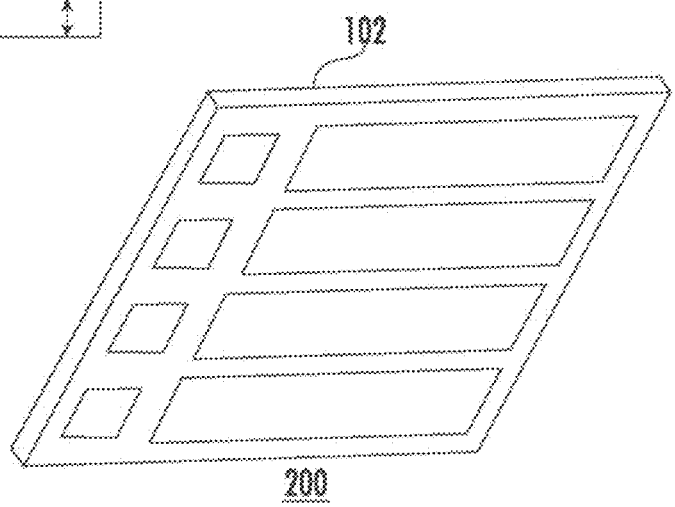
FIG. 2B shows a perspective view of a second main surface of the protection device of FIG. 2A, according to embodiments of the disclosure.
Figure 2C:
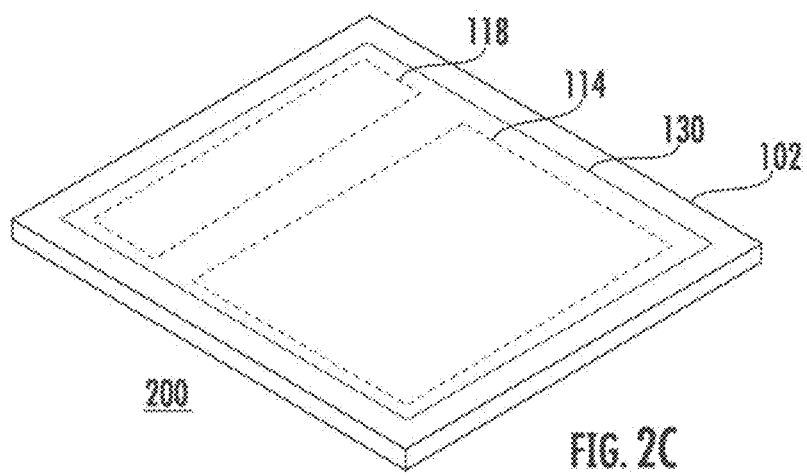
FIG. 2C shows a perspective view of a first main surface of the protection device of FIG. 2A, according to embodiments of the disclosure.

In particular embodiments, the second main surface 105 of the protection device 100 or similar devices may be sub-divided into a plurality of regions, to contact to a plurality of different lines. Turning to FIG. 2A, FIG. 2B, and FIG. 2C there is shown a plan view of a second main surface, a perspective view of the second main surface, and a perspective view of a first main surface, respectively, for a protection device 200, according to embodiments of the disclosure. In this example, the protection device 200 may be arranged with the layers, generally as shown in FIG. 1A, discussed above. The layer 116 may be divided into a first plurality of P-type regions, shown as regions 204, and a second plurality of N-type regions, shown as regions 206. The regions 204 may be electrically isolated from one another on the second main surface 105, while the regions 206 are electrically isolated from one another on the second main surface 105, by the provision of an insulator region 208.

Figure 3A:
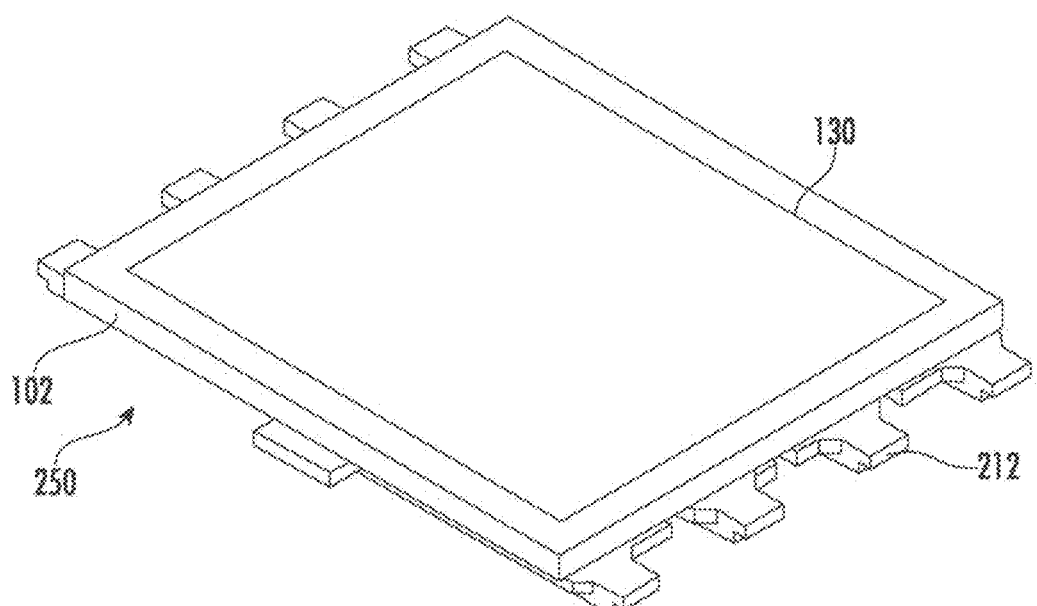
FIG. 3A shows a top perspective view of a protection device assembly, according to embodiments of the disclosure.
Figure 3B:
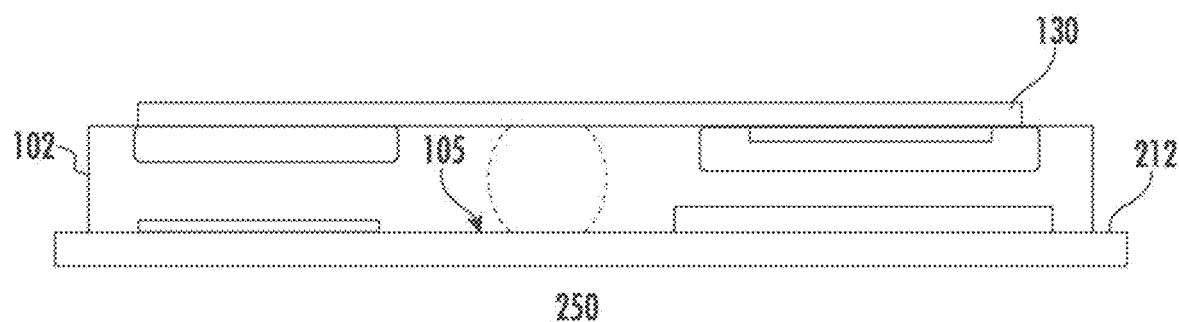
FIG. 3B shows a side cross-sectional view of a protection device assembly of FIG. 3A, according to embodiments of the disclosure.

According to various embodiments of the disclosure, a protection device, such as protection device 100 or protection device 200, may be packaged in a simplified assembly, including a simplified leadframe. Because the functionality of two PN diodes and a thyristor is included in a single semiconductor die, a package, including a multiline protection device, may be constructed using a leadframe disposed just along one side of a semiconductor die, in a generally planar configuration. FIG. 3A shows a top perspective view, while FIG. 3B shows a side cross-sectional view of a protection device assembly 250, according to embodiments of the disclosure. The protection device assembly 250 may include other parts, including a housing (not shown). In addition to the semiconductor substrate 102, described above, the protection device assembly 250 may include a leadframe 212, disposed in contact with the second main surface.

Figure 4A:
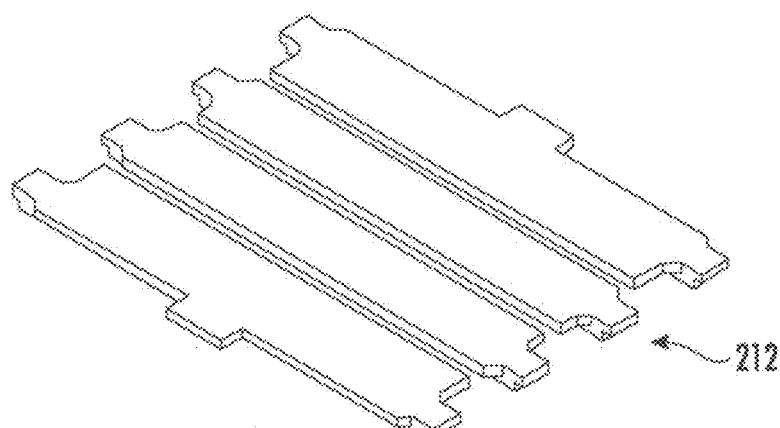
FIG. 4A illustrates a perspective view of a leadframe, at one stage of assembly, according to embodiments of the disclosure.
Figure 4B:
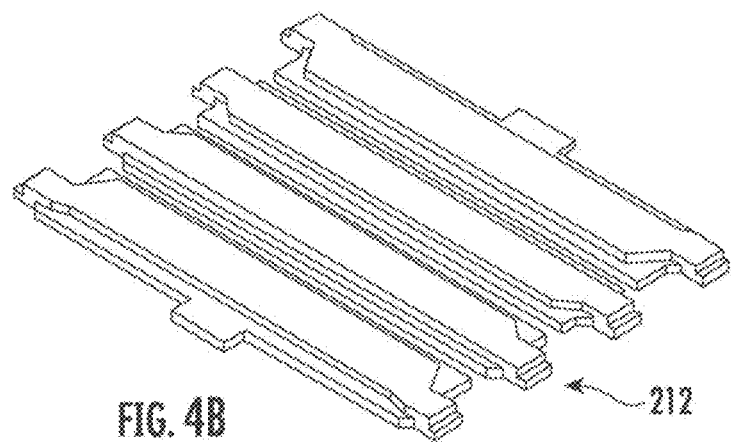
FIG. 4B illustrates a perspective view of the leadframe of FIG. 4A at another stage of assembly.

FIG. 4A and FIG. 4B illustrate a perspective view of the leadframe 212, at various stages of assembly. In FIG. 4A, the leadframe 212 is shown, corresponding to a single die or chip. At FIG. 4B, a bottom perspective view of the leadframe 212 is shown, which view illustrates the edge structure in half thickness for encapsulation (such as epoxy mold compound) locking of leadframe 212.

Figure 4C:
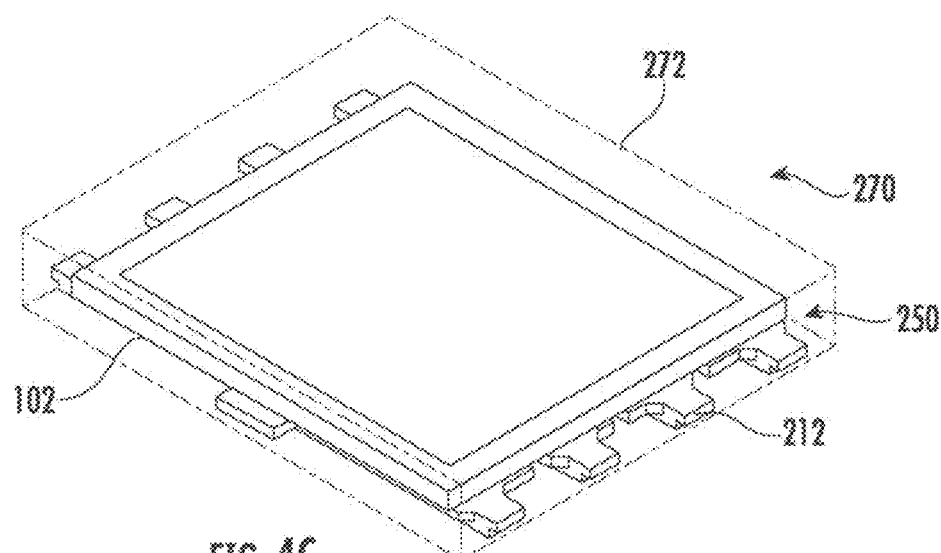
FIG. 4C depicts a perspective view of the protection device assembly 250.

FIG. 4C depicts a perspective view of the protection device assembly 250, when assembled into a package 270, including a housing 272. As shown, the protection device assembly 250, including the semiconductor substrate 102, which substrate is soldered to the leadframe 212 may be disposed within a package 270, having the general shape of a rectangular prism. The housing 272 may be an insulating housing, formed of a molding, such as an epoxy mold compound according to some embodiments. The embodiments are not limited in this context, however.

Figure 5A:
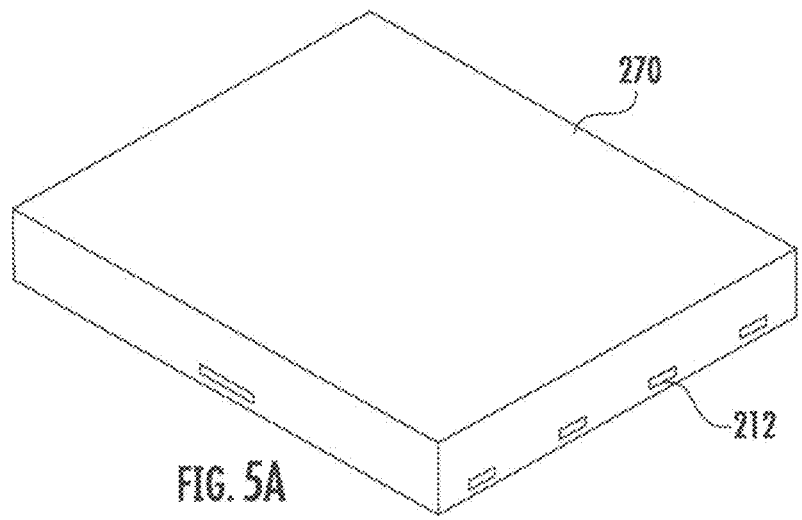
FIG. 5A shows a top perspective view of a package, according to embodiments of the disclosure.
Figure 5B:
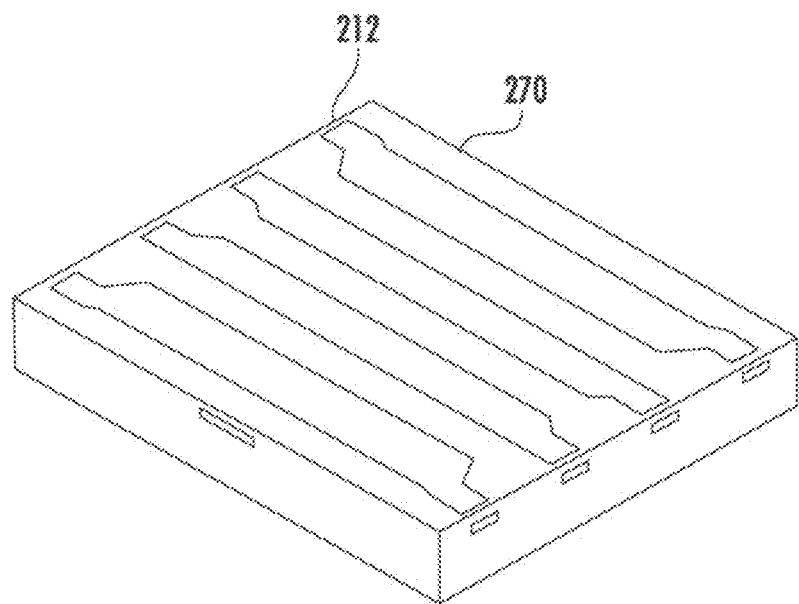
FIG. 5B shows a bottom perspective view of the package of FIG. 5A, according to embodiments of the disclosure.

The leadframe 212 may be disposed toward one side of the housing 272, shown in more detail in FIG. 5A and FIG. 5B. Turning to FIG. 5A and FIG. 5B, there are shown a top perspective view and a bottom perspective view of the package 270, respectively. As shown, the leadframe 212 may be partially exposed on the bottom surface of package 270. While shown as a singulated structure, according to various embodiments, the package 270 may be assembled from a leadframe structure for multiple die where leadframe definition, die attachment, and encapsulation with housing 272 takes place for multiple semiconductor substrates, before singulation.

Figure 5C:
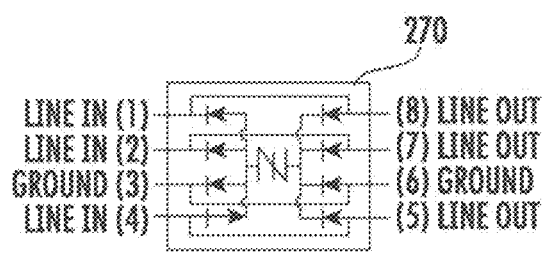
FIG. 5C provides an equivalent circuit representation of the package of FIG. 5A, in accordance with embodiments of the disclosure.

FIG. 5C provides an equivalent circuit representation of the package 270, in accordance with embodiments of the disclosure. As shown therein, a SIDACTor is disposed between a first set of four diodes (to the left) and a second set of four diodes (to the right). The set of diodes to the left are coupled to a set of line in lines and ground, while the diodes to the right are coupled to corresponding line out lines and to ground.

While the present embodiments have been disclosed with reference to certain embodiments, numerous modifications, alterations and changes to the described embodiments are possible without departing from the sphere and scope of the present disclosure, as defined in the appended claims. Accordingly, it is intended that the present embodiments not be limited to the described embodiments, and that it has the full scope defined by the language of the following claims, and equivalents thereof.

What is claimed is:

1. A protection device, comprising:
a semiconductor substrate;
a thyristor-type device, formed within the semiconductor substrate, the thyristor-type device extending from a first main surface of the semiconductor substrate to a second main surface of the semiconductor substrate;
a first PN diode, formed within the semiconductor substrate;
a second PN diode, formed within the semiconductor substrate, wherein the thyristor-type device is arranged in electrical series between the first PN diode and the second PN diode; and
an electrical isolation barrier, extending from the first main surface to the second main surface, and disposed between the second PN diode and the thyristor-type device.

2. The protection device of claim 1, wherein the second PN diode extends from the first main surface to the second main surface.

3. The protection device of claim 1, wherein the first PN diode extends from the second main surface and forms a portion of the thyristor-type device.

4. The protection device of claim 1, further comprising a front surface metal layer, disposed on the first main surface and disposed in contact with the thyristor-type device and the second PN diode.

5. The protection device of claim 1, wherein the second main surface comprises:
a first plurality of P-type regions, electrically isolated from one another; and
a second plurality of N-type regions, electrically isolated from one another, and equal in number to the first plurality of P-type regions.

6. A protection device assembly, comprising:
a semiconductor substrate having a first main surface and a second main surface, and comprising:
a thyristor-type device, extending from a first main surface to the second main surface;
a first PN diode, extending from the second main surface; and
a second PN diode, wherein the thyristor-type device is arranged in electrical series between the first PN diode and the second PN diode;
a front surface metal layer, disposed on the first main surface;
a leadframe, disposed in contact with the second main surface; and
an electrical isolation barrier, extending from the first main surface to the second main surface, and disposed between the second PN diode and the thyristor-type device.

7. The protection device assembly of claim 6, the leadframe comprising: a plurality of leads, disposed in contact with the second main surface.

8. The protection device assembly of claim 7, the second main surface comprising:
a first plurality of P-type regions, electrically isolated from one another; and
a first plurality of N-type regions, electrically isolated from one another, and equal in number to the first plurality of P-type regions, wherein the first plurality of P-type regions are elongated along a first direction, wherein the plurality of leads extend along the first direction, in contact with the first plurality of P-type regions and the first plurality of N-type regions.

9. The protection device assembly of claim 7, further comprising an insulating housing, extending around the semiconductor substrate and between adjacent leads of the plurality of leads.

10. The protection device assembly of claim 6, wherein the leadframe comprises four leads.

11. The protection device assembly of claim 6, wherein the second PN diode extends from the first main surface to the second main surface.

12. A line protection device, comprising:
a semiconductor substrate having a first main surface and a second main surface, the semiconductor substrate comprising;
a thyristor-type device, extending from a first main surface to the second main surface;
a first PN diode, extending from the second main surface;
a second PN diode, wherein the thyristor-type device is arranged in electrical series between the first PN diode and the second PN diode; and
an electrical isolation barrier, extending from the first main surface to the second main surface, and disposed between the second PN diode and the thyristor-type device;

a front surface metal layer, disposed on the first main surface; and a leadframe, disposed in contact with the second main surface, the leadframe comprising a plurality of leads, arranged electrically in parallel to one another.

13. The line protection device of claim 12, the second main surface comprising:

a first plurality of P-type regions, electrically isolated from one another; and a first plurality of N-type regions, electrically isolated from one another, and equal in number to the first plurality of P-type regions, wherein the first plurality of P-type regions are elongated along a first direction, wherein the plurality of leads extend along the first direction, in contact with the first plurality of P-type regions and the first plurality of N-type regions.

14. The line protection device of claim 12, wherein the leadframe comprises four leads.

15. The line protection device of claim 12, wherein the second PN diode extends from the first main surface to the second main surface.

16. The line protection device of claim 12, the semiconductor substrate further comprising an electrical isolation barrier, extending from the first main surface to the second main surface, and disposed between the second PN diode and the thyristor-type device.

17. The line protection device of claim 12, further comprising an insulating housing, extending around the semiconductor substrate and between adjacent leads of the plurality of leads.

* * * * *